United States Patent [19]
Takeda et al.

[11] Patent Number: 4,814,709
[45] Date of Patent: Mar. 21, 1989

[54] METHOD OF SELECTING SPECIFIC REGION OF SAMPLE

[75] Inventors: Ryuzaburo Takeda, Mito; Hideaki Koizumi, Katsuta; Toshihiro Ishizuka, Katsuta, all of Japan

[73] Assignee: Hitachi, Ltd., Tokyo, Japan

[21] Appl. No.: 59,879

[22] PCT Filed: Sep. 25, 1986

[86] PCT No.: PCT/JP86/00492
§ 371 Date: May 26, 1987
§ 102(e) Date: May 26, 1987

[30] Foreign Application Priority Data
Sep. 25, 1985 [JP] Japan ................................ 60-211782

[51] Int. Cl.⁴ .......................................... G01R 33/20
[52] U.S. Cl. ................................................ 324/309
[58] Field of Search ............... 324/307, 308, 309, 310, 324/311, 314

[56] References Cited
U.S. PATENT DOCUMENTS
4,563,647 1/1986 Young ................................ 324/309
4,712,066 12/1987 Luyten et al. ...................... 324/309

Primary Examiner—Tom Noland
Assistant Examiner—Kevin D. O'Shea
Attorney, Agent, or Firm—Antonelli, Terry & Wands

[57] ABSTRACT

This invention relates to a selection method of a specific region of a sample which is suitable for use in a nuclear magnetic resonance (NMR) imaging. Selection of a specific region suitable for obtaining multi-dimensional spatial information can be preferably made. To satisfy this requirement, the spin of the specific region of the sample is brought down in a direction at right angles to a static magnetic field, the regions other than the specific region are, in the mean time, brought down in a direction at right angles to the static magnetic field, and thereafter the static magnetic field is rendered non-uniform to that the spins of the regions other than the specific region become saturated.

4 Claims, 6 Drawing Sheets

METHOD OF SELECTING SPECIFIC REGION OF SAMPLE

DESCRIPTION

1. TECHNICAL FIELD

This invention relates to a method of selecting a specific region of a sample, and more particularly to a method of selecting a specific region of a sample which is suitable for NMR (nuclear magnetic resonance) imaging.

2. BACKGROUND ART

When a sample having atomic nuclei whose spin quantitization number is not zero is placed in a static magnetic field, the atomic nuclei exhibit a macro behaviour as an aggregate and can be regarded as a magnetization vector having magnetization in parallel with the direction of the static magnetic field and angular momentum. The relation between a magnetic moment $\mu$ representing the magnitude of magnetization and the angular momentum J is expressed as follows with $\gamma$ representing a gyromagnetic ratio:

$$\mu = \gamma J \quad (1)$$

The equation of motion can be expressed as follows with $H_0$ representing the intensity of the magnetic field:

$$\frac{dJ}{dt} = \mu \times H_0 \quad (2)$$

When eq. (1) is differentiated and put into eq. (2), there is obtained the following equation:

$$\frac{d\mu}{dt} = \mu \times (\gamma \cdot H_0) \quad (3)$$

Eq. (3) can be expressed as follows by a coordinate system rotating at an angular velocity $\omega$:

$$\left(\frac{d\mu}{dt}\right)_{rot} = \mu \times \gamma H_0 + \omega = \mu \cdot \gamma \cdot H_e \quad (4)$$

where $$H_e = H_0 + \frac{\omega}{\gamma} \quad (5)$$

The frequency $\omega$ at which $H_e = 0$ is referred to as a "resonance frequency $\omega_0$" (angular velocity expression) and is represented by the following equation:

$$\omega_0 = -\gamma \cdot H_0 \quad (6)$$

If the direction of the static magnetic field $H_0$ is called "Z" and directions orthogonal thereto are "X, Y" and a magnetic field $H_1$ is applied from the X direction (this means a radio frequency magnetic field rotating at $\omega_0$), the magnetization vector rotates on the Z - Y plane at an angular velocity expressed by $\gamma \cdot H_1$. A magnetic field $H_1$ which is applied until the magnetization vector is 90° relative to the Z axis (falls on the X - Y plane) is referred to as "90° pulse", and "180° pulse" is defined similarly. The component of the X - Y plane of the magnetization vector is induced as a signal in a coil disposed on the X - Y plane. The description given above explains briefly the principle of nuclear magnetic resonance.

One of the conventional methods which selectively obtains a signal from a specific region of a sample on the basis of the principle described above applies a radio frequency magnetic field having frequency components $f_1 \, (= \gamma h_1) \sim f_2 \, (= \gamma h_2)$ (where $h_1$ and $h_2$ represent the intensity of magnetic field in specific regions $x_1$ and $x_2$ of a sample in the x direction, respectively) to the sample in the presence of a gradient magnetic field in the x direction of the sample, and then nutates or tips by 90° the magnetization vector in that region in order to selectively excite the magnetization vectors of the specific region $x_1 \sim x_2$ of the sample.

This method is excellent to selectively obtain a signal in a uni-dimensional direction. However, since the magnetization vector is brought down by 90° for one selection, this method cannot be applied a plurality of times in order to make selections a plurality of times and to obtain spatial information on regions of a plurality of dimensions. In other words, in accordance with this method, selection for obtaining the spatial information of two or more dimensions cannot be made.

Another conventional method picks up selectively only the frequency components $f_1 \sim f_2$ corresponding to the specific region by bringing down by 90° the magnetization vectors for a wide range including the specific region $x_1 \sim x_2$, then applying the gradient magnetic field and controlling the frequency band of the resulting signal. This method is a so-called "frequency filter system" and includes a system by use of an analog filter and a system using a digital filter in a narrow sense of the word. The analog filter has the disadvantage that the frequency band cannot be changed arbitrarily. Furthermore, its expansion to the spatial selection of two or more dimensions is not possible. The digital filter includes a digital filter in a narrow sense (that is, an ordinary digital filter system utilizing fold-in) and a filter utilizing Fourier transform.

The digital filter in a narrow sense has the advantage that the frequency band can be changed arbitrarily, but its expansion to two or more dimensions is not possible in the same way as the analog filter. A data sampling period $t_{int}$ for digitizing the signal must satisfy the following condition from the Nyquist's theorem:

$$t_{int} \leq \frac{1}{2f_{max}} \quad (7)$$

where $f_{max}$ is a maximum frequency contained in the signal.

Accordingly, a sampling rate is determined by the signal band of the excited signal quite irrelevantly to the frequency band that corresponds to the specific region.

The filter utilizing Fourier transform samples the signal, converts it to a digital signal, subjects altogether the sampled data to Fourier transform and picks up only the data of the object frequency band ($f_1 \sim f_2$) from the resulting data. This Fourier transform method can separate the spatial information of multiple dimensions by skilfully utilizing the principle of nuclear magnetic resonance such as two-dimensional Fourier transform imaging method and three-dimensional Fourier transform imaging method, and moreover, arbitrary filtration is possible in principle. This method collects only the data relating to the specific data and discards the rest from the data obtained by ordinary processing. Therefore, this method is excellent in that any particular processing is not necessary.

In accordance with this Fourier transform method, too, the condition of the sampling rate expressed by the equation (7) must be satisfied. On the other hand, the data acquisition time $T_{aq}$ must satisfy the following condition in order to obtain resolution $\Delta f$:

$$T_{aq} \geqq \frac{1}{\Delta f} \qquad (8)$$

Therefore, the number of data points N is given as follows from eq. (7) and (8):

$$N = \frac{T_{aq}}{t_{int}} = \frac{\frac{1}{\Delta f}}{\frac{1}{2f_{max}}} = \frac{2f_{max}}{\Delta f} \qquad (9)$$

If the frequency band corresponding to the object space is $f^0_{max}$ resolution is $\Delta f^0$, the necessary data point number N is given as follows:

$$N_0 = \frac{2f^0_{max}}{\Delta f^0} \qquad (10)$$

When the ratio of eq. (9) to eq. (10) is obtained, $$N/N_0 = (\Delta f^0/\Delta f)/(f^0_{max}/f_{max}) \qquad (11)$$

$$\frac{N}{N_0} = \frac{\Delta f^0}{\Delta f} \times \frac{f_{max}}{f^0_{max}} \qquad (12)$$

In other words, when the same resolution is maintained, a greater data point number becomes necessary with a higher selection ratio, and if the data point number is kept the same, it means that resolution drops. To avoid such a trade-off, it is by all means necessary to bring the object region into conformity with the signal generation region.

DISCLOSURE OF THE INVENTION

The present invention is directed to provide a method of selecting a specific region of a sample which is suitable for obtaining multidimensional spatial information.

In accordance with the present invention, there is provided a method of selecting a specific region of a sample which includes the steps of arranging a sample in a static magnetic field so that the spin in the sample is oriented parallel to the static magnetic field, bringing down the spin of the sample in the specific region in a direction at right angles to the static magnetic field and then orienting it parallel to the static magnetic field so that the spin of the sample in regions other than the specific region is brought down in a direction at right angles to the static magnetic field, and making non-uniform the static magnetic field so that the spin of the sample in the regions other than the specific region becomes saturated.

BEST MODE FOR CARRYING OUT THE INVENTION

Figure 1:
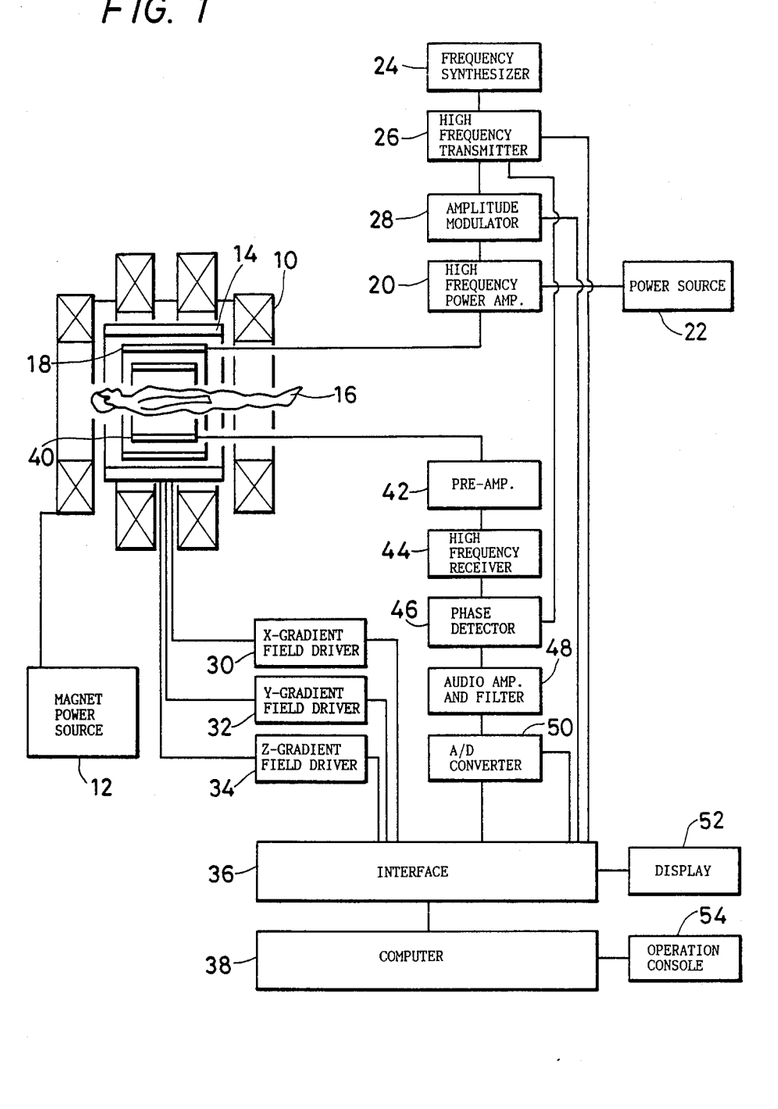
FIG. 1 is a block diagram of a nuclear magnetic resonance imaging apparatus for practising the method of the present invention in accordance with one embodiment thereof.

Referring to FIG. 1, a current is supplied from a magnet power source 12 to a magnet 10 to generate a uniform static magnetic field $H_0$. A sample 16 is disposed at the center of the magnet 10. A radiation coil 18 is connected to a power source 22 through a radio frequency (RF) power amplifier 20. The power amplifier 20 receives a pulse generated by a frequency synthesizer 24 through a radio frequency (RF) transmitter 26 and an amplitude modulator 28 and applies a radio frequency (RF) voltage to the radiation coil 18. A gradient magnetic field coil device 14 is connected to an X gradient magnetic field driver 30, a Y gradient magnetic field driver 32 and a Z gradient magnetic field driver 34 and generates gradient magnetic fields in the X, Y and Z direction by a computer 38 which is connected to each of the gradient magnetic field drivers through an interface 36.

A reception coil 40 detects a nuclear magnetic resonance (NMR) signal from the sample 16 and the detected NMR signal is applied to a phase detector 46 through a pre-amplifier 42 and a radio frequency (RF) receiver 44. The phase detector 46 is connected to the RF transmitter 26, detects the phase of the resonance signal using the frequency of the voltage applied to the radiation coil 18, that is, the frequency of the RF magnetic field, as the reference signal, and applies it to an audio amplifier and a filter 48. The audio amplifier and the filter 48 select predetermined NMR signals and display them on a display 52 through and A/D convertor 50 and the interface 36. Reference numeral 54 represents an operation panel of the computer 38.

Figure 2:
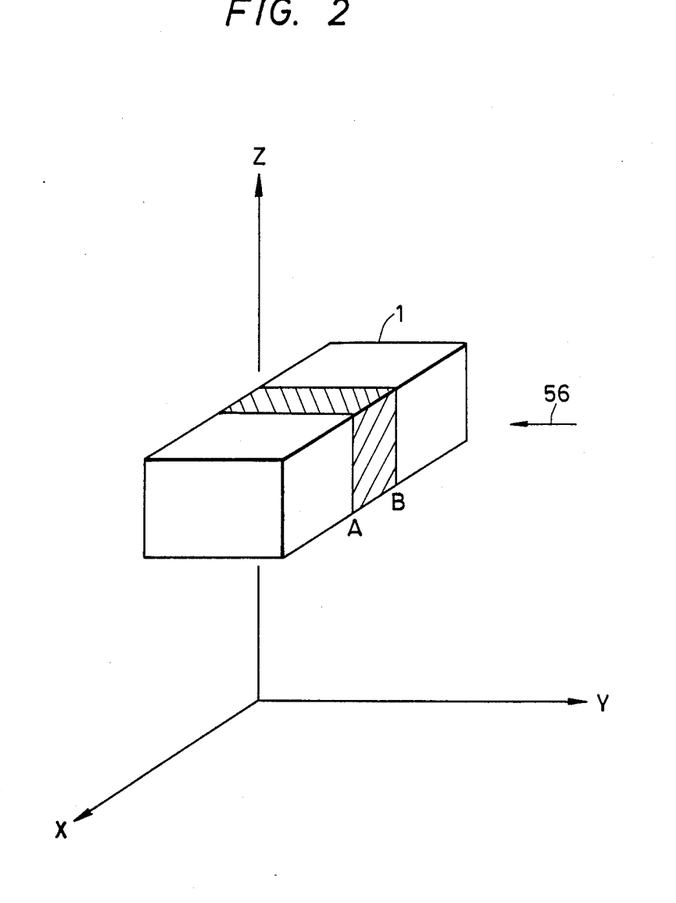
FIG. 2 is a perspective view showing the state of arrangement of a sample in a static magnetic field.

It will be assumed that the sample 1 as a subject is arranged as shown in FIG. 2 and the Z axis represents the direction of the static magnetic field $H_0$. The X and Y axis represent in this case two axes that are perpendicular to the Z axis and orthogonally cross each other. Though selective saturation in the X direction will be described in this embodiment for convenience' sake, the same principle can be applied to the other axes.

In FIG. 2, a hatched portion (A~B) is the specific region, that is, the object region.

Figure 3:
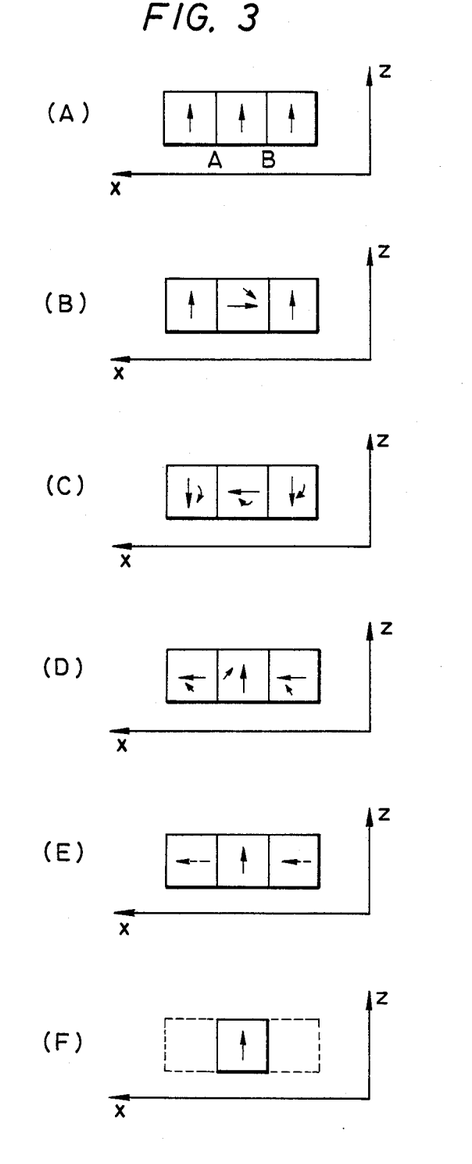
FIG. 3(A) is a schematic view showing the first state of magnetization vector of the sample.
FIG. 3(B) is a schematic view showing the second state of the magnetization vector of the sample.
FIG. 3(C) is a schematic view showing the third state of the magnetization vector of the sample.
FIG. 3(D) is a schematic view showing the fourth state of the magnetization vector of the sample.
FIG. 3(E) is a schematic view showing the fifth state of the vector of the sample.
FIG. 3(F) is a schematic view showing the sixth state of the vector of the sample.

FIG. 3 is a view when viewed in the direction of arrow 56 in FIG. 2. When the gradient magnetic field acts, the magnetization vectors of the sample 1 face in the Z direction throughout the entire regions. Therefore, a gradient magnetix field $G_x$ having different magnetic intensity in accordance with positions in the X direction is applied to the static magnetic field. Next, 90° pulse selective radiation is effected for the object region A~B. In other words, an RF magnetic field having concentratedly a component between a resonance frequency corresponding to the magnetic field intensity of the point A and a resonance frequency corresponding to the magnetic field intensity of the point B is applied to the sample, in order to selectively excite the magnetization vectors of the portion of the region A~B of the sample 1 and to bring down the spins or vectors on the X - Y plane, as shown in FIG. 3(B).

When selective radiation is effected and the magnetization vectors of the region A~B are brought down on the X - Y plane, the magnetization vectors on the X - Y plane cause phase disturbance. This is because the static magnetic field $H_0$ is not completely uniform and the gradient magnetic field is applied. Therefore, the phases must be made uniform. To make them uniform, an echo is generated. This echo is generated by applying once again the gradient magnetic field $G_x$ and by applying a 180° pulse. At this time, the direction of the magnetization vectors is inverted such as shown in FIG. 3(C).

Thereafter, a non-selective 90° pulse is applied. That is to say, the 90° pulses are applied to the entire regions of the sample 1 as shown in FIG. 3(D) to direct the magnetization vectors between the region (A~B) in the direction of the Z axis and to bring down the magnetization vectors of the rest of portions onto the X - Y plane. Next, $G_x$ is applied in order to impart non-uniformity (homo spoil pulse) of the magnetic field. $G_Y$ or $G_Z$ may be applied in place of $G_x$. As a result, the components of the magnetization vectors on the X - Y plane disappear due to the phase disturbance, and the nuclear spins in the regions other than the region A~B can be saturated (FIG. 3(E)).

As shown in FIG. 3(F), therefore, among the magnetization vectors of the sample 1, only the magnetization vectors of the portion A~B can be left. For this reason, the NMR signal is not generated from the regions other than the object region and the necessary data number can be decreased.

Figure 4:
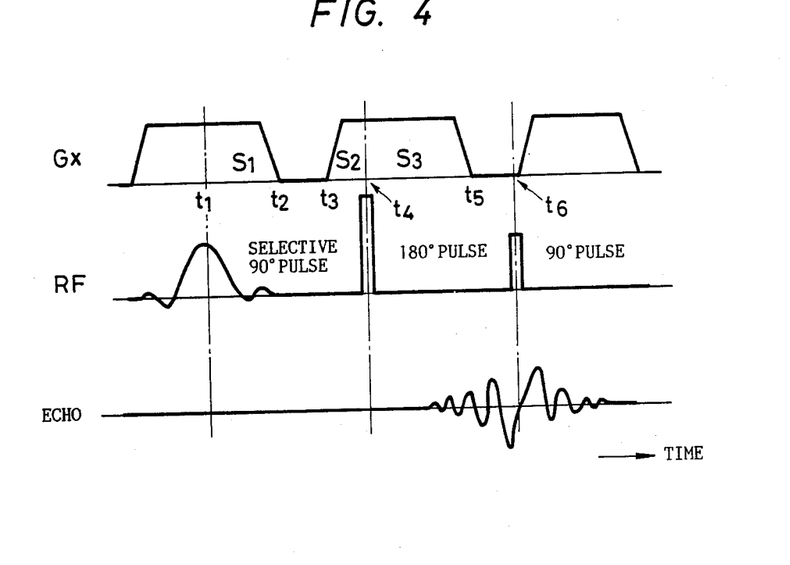
FIG. 4 is a time chart of a first embodiment of the method of the present invention.

The application timing of the gradient magnetic field $G_x$, the RF magnetic field and the generating timing of the echo is shown in FIG. 4, where $S_1$, $S_2$ and $S_3$ are as follows, respectively;

$$S_1 = \int_{t_1}^{t_2} G_x dt, \quad S_2 = \int_{t_3}^{t_4} G_x dt,$$

$$S_3 = \int_{t_4}^{t_5} G_x dt$$

The application of $G_x$ is stopped at a timing $t_5$ which satisfies the following relation:

$$S_1 + S_2 = S_3 \quad (13)$$

The 180° pulse is generated at $t_4$ and the echo is applied at $t_6$ at which $t_1 \sim t_4$ is equal to $t_4 \sim t_6$. The 90° pulse is applied to $t_6$. (B)~(E) correspond to those of FIG. 3, respectively.

Next, the magnitude of the magnetization vectors that attenuate during the operation described above will be discussed. Since the 180° pulse echo method is employed, the attenuation quantity in the period $t_1 \sim t_6$ depends on $T_2$ which is a spin-spin relaxation time. If $T_2$ is at least 60 msec, the attenuation quantity is $1-1^{-6/60}=0.10$ and maximum 10% if $t_1 \sim t_6$ is below 6 msec. This renders no problem in consideration of the fact that $t_1 \sim t_6$ can be reduced further and $T_2$ is generally greater than the value described above.

When the operation described above is effected for $G_Y$ or $G_Z$, or both of $G_Y$ and $G_Z$, two- or three-dimensional object regions can be selected while the magnetization vectors of the other regions can be saturated.

Figure 5:
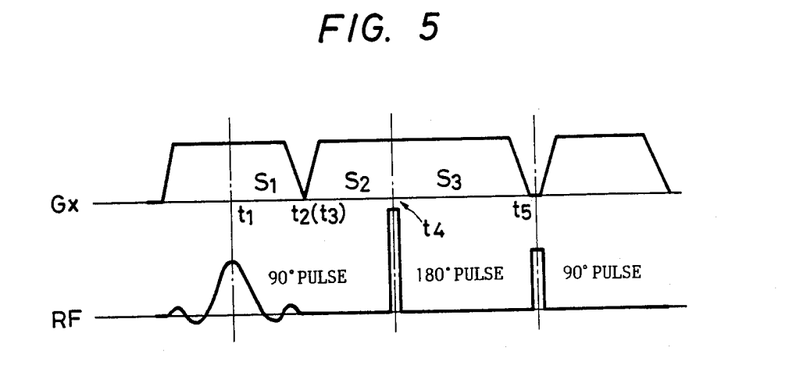
FIG. 5 is a time chart of a second embodiment of the present method.
Figure 6:
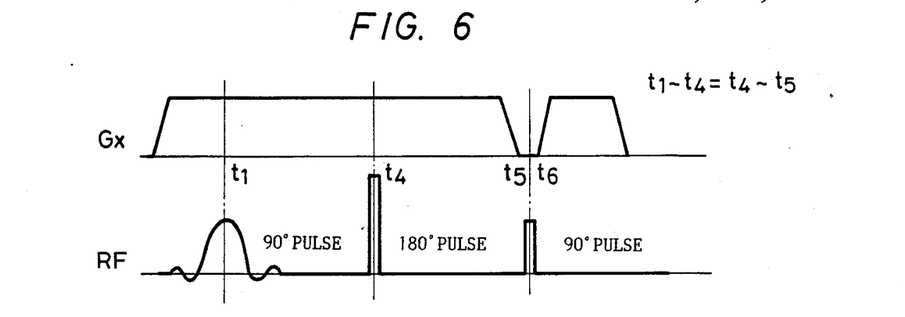
FIG. 6 is a time chart of a third embodiment of the present method.

As the echo generation means shown in this embodiment, $t_2$ may be in agreement with $t_3$ as shown in FIG. 5 or $G_x$ may be applied continuously during $t_1 \sim t_4$. In the embodiment of the invention shown in FIG. 6, the following condition must be satisfied:

$$\int_{t_1}^{t_4} G_x dt = \int_{t_4}^{t_5} G_x dt$$

Figure 7:
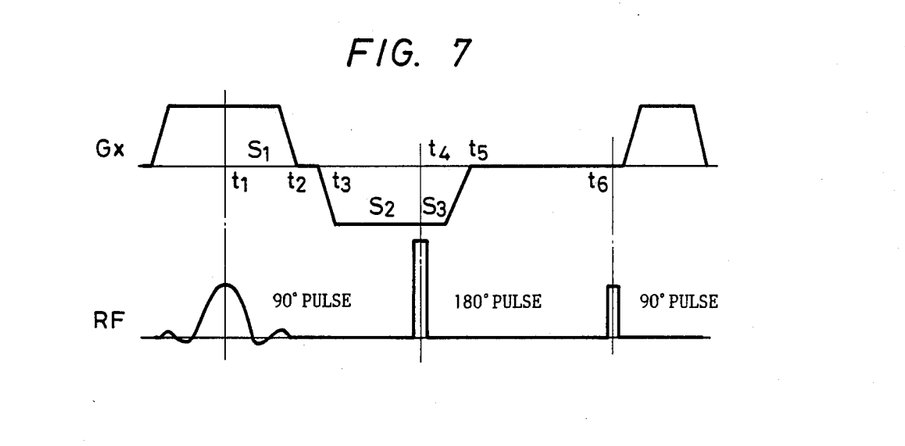
FIG. 7 is a time chart of a fourth embodiment of the present method.

As the echo generation means shown in the embodiment, $G_x$ may be applied as shown in FIG. 7 with the proviso that $S_1 + S_3 = S_2$ must be satisfied.

Figure 8:
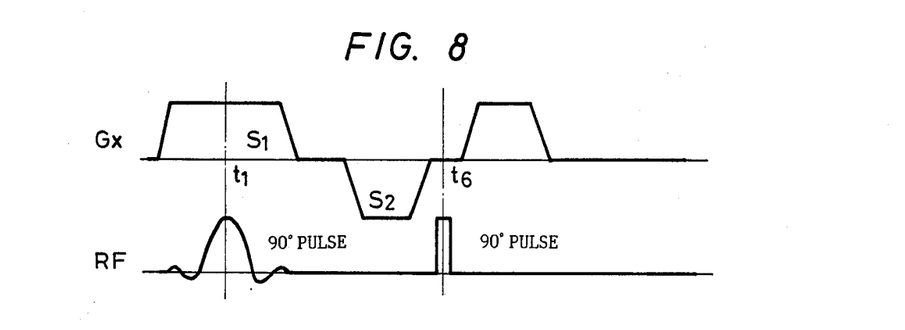
FIG. 8 is a time chart of a fifth embodiment of the present method.

The polarity of $G_x$ may be switched as shown in FIG. 8 as the echo generation means shown in the drawing with the proviso that $S_1 = S_2$.

The 180° pulse shown in the embodiment may be the selective radiation pulse or the non-selective pulse.

Figure 9:
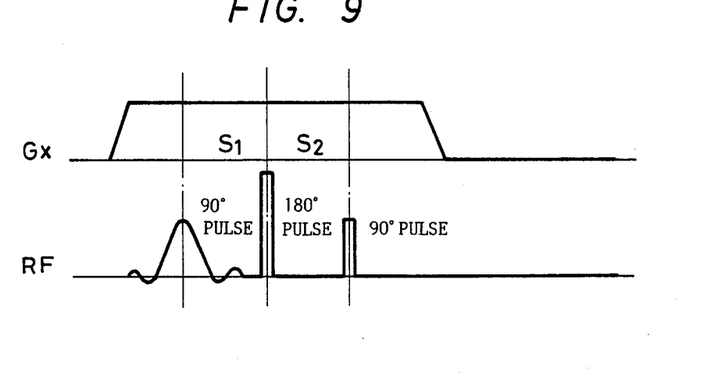
FIG. 9 is a time chart of a sixth embodiment of the present method.

The non-uniform magnetic field to be applied originally after completion of the application of the 90° pulse may be applied simultaneously with the 90° pulse provided that the application time of the 90° pulse to be applied at $t_6$ in the embodiment is extremely short and the non-uniformity of the magnetic field is such that the phase disturbance within the application time can be neglected. In this instance, the gradient magnetic field applied in order to generate the echo may be applied by the same gradient magnetic field as the non-uniform magnetic field described above. In other words, the gradient magnetic field may be applied continuously before and after the 90° pulse shown in FIG. 9.

It is also possible to employ the arrangement wherein FIGS. 3(B) and (C) are omitted, the non-selective 90° pulse is applied in the presence of $G_x$ to bring down by 90° the spins of the sample as a whole and then the selective 90° pulse having a different polarity is applied in the presence of $G_x$ so as to return the spins of the region A~B to the direction of the static magnetic field as shown in FIG. 3(D).

In the embodiment described above, the RF magnetic field is applied along the Y axis. However, it may be applied in an arbitrary direction so long as the axis is on the X - Y plane.

Figure 10:
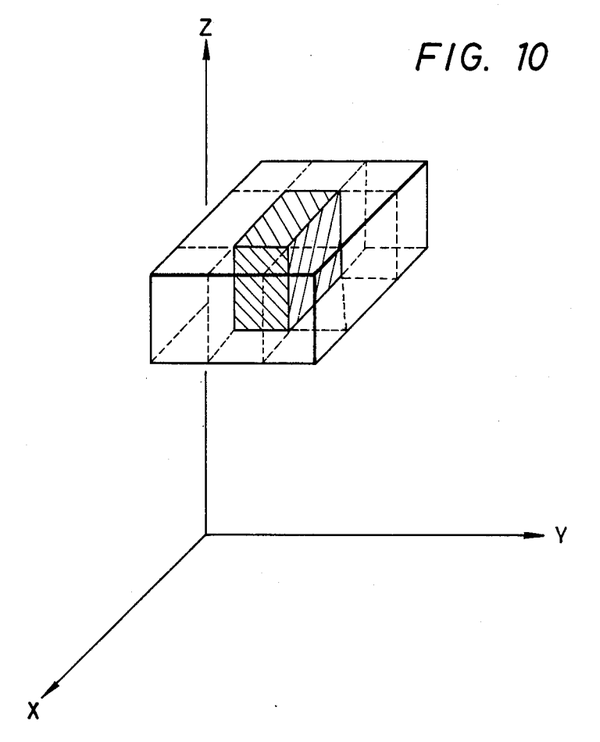
FIG. 10 is a perspective view showing the state of arrangement of the sample and useful for explaining an application example of the present method.

FIG. 10 is an explanatory view for explaining the application example of the NMR signal detecting method in accordance with the present invention.

The selective saturation method described already is effected for each of the X and Y axes to select two-dimensionally the sample region as shown in FIG. 10. The sample region is sliced in the direction of the Z axis.

Thereafter, an ordinary spin warp method is practised for imaging. The spin warp method is described in detail in Edelsteim W. A., Hutchison J. M. S., Johnson G. and Redpath T., "Spinwarp NMR imaging and applications to human whole-body imaging", Phys. Med. Bio. (1980; 25: 751–756).

The sampling data point number $N_x$ is given as follows with X representing the frequency encoding direction, Y representing the phase encoding direction and $f_{max,x}$ representing the maximum frequency in the direction of the X axies expressed by eq. (9):

$$Nx = \frac{2f_{max,x}}{\Delta f}$$

Since the maximum value of X is small by the selective saturation method, $f_{max,x}$ becomes small, and $N_x$ can be eliminated by making $\Delta f$ constant. On the other hand, the data point number can be decreased in the phase encoding direction, too. Namely, the number of times of phase encoding can be decreased and the number of times of scanning can be reduced. The measurement time T can be expressed as follows:

$$T = t_{SCAN} \times n$$

where $t_{SCAN}$ is a scanning time and n is the number of times of scanning.

If the number of times of scanning can be decreased, the measurement time can be reduced. This means that the restriction time of a subject can be shortened and his pain can be mitigated. Eq. (9) can be modified as follows:

$$\Delta f = \frac{2f_{max}}{N}$$

If $f_{max}$ is made small by the selective saturation method, resolution $\Delta f$ can be made small if N is kept constant. In other words, the accuracy of resolution can be improved.

Next, the second application example will be described.

The selective saturation method of the present invention is carried out in the direction of the X axis for a sample that moves in the X direction with the passage of time. After the passage of a suitable period, the magnetization vectors are excited at an arbitrary point in the X direction and the signal is detected.

The moving speed of the sample can be determined from the time passed after practising the selective saturation method and the signal detection position in the X direction.

What is claimed is:

1. A method of selecting a specific region of a sample including the steps of: arranging the sample in a static magnetic field to thereby orient the spins of the sample in a direction parallel to the static magnetic field; bringing down selectively the spins of the specific region of the sample in a direction perpendicular to the static magnetic field; inverting the brought down spins and orienting the inverted spins in the direction parallel to the static magnetic field while bringing down the spins of regions of the sample other than the specific region in the direction perpendicular to the static magnetic field; and making non-uniform the static magnetic field to thereby saturate the spins of the regions other than the specific region.

2. A method of selecting a specific region of a sample including the steps of: arranging the sample in a static magnetic field to thereby orient the spins of the sample in a direction parallel to the static magnetic field; bringing down selectively the spins of the specific region of the sample in a direction perpendicular to the static magnetic field; inverting the brought down spins; bringing down by 90° the inverted spins and the spins of regions of the sample other than the specific region to thereby orient the inverted spins in the direction parallel to the static magnetic field and the spins of regions of the sample other than the specific region in the direction perpendicular to the static magnetic field; and making non-uniform the static magnetic field to thereby saturate the spins of the regions of the sample other than the specific region.

3. A method of selecting a specific region of a sample including the steps of: arranging the sample in a static magnetic field to thereby orient the spins of the sample in a direction parallel to the static magnetic field; applying a first radio frequency pulse having a selected frequency component to the sample to thereby bring down the spins of the specific region of the sample in a direction perpendicular to the static magnetic field; applying a second radio frequency pulse to the sample to thereby invert the brought down spins; applying a third radio frequency pulse to the sample to thereby orient the inverted spins in the direction parallel to the magnetic field and the spins of regions of the sample other than the specific region in the direction perpendicular to the static magnetic field; and making non-uniform the static magnetic field to thereby saturate the spins of the regions of the sample other than the specific region.

4. A method of selecting a specific region of a sample including the steps of: arranging the sample in a static magnetic field to thereby orient the spins of the sample in a direction parallel to the static magnetic field; applying a first radio frequency pulse having a selected frequency component to the sample to thereby bring down the spins of the specific region of the sample in a direction perpendicular to the static magnetic field; applying a second radio frequency pulse to the sample to thereby invert the spins of the sample; applying a third radio frequency pulse to the sample to thereby bring down the inverted spins by 90° so as to orient the spins of the specific sample in the direction parallel to the static magnetic field and the spins of regions of the sample other than the specific region in the direction perpendicular to the static magnetic field; and applying a magnetic field gradient to the static magnetic field to thereby make non-uniform the static magnetic field so as to saturate the spins of the regions of the sample other than the specific region.

* * * * *